United States Patent [19]
Kuo

[11] Patent Number: 5,808,317
[45] Date of Patent: Sep. 15, 1998

[54] SPLIT-GATE, HORIZONTALLY REDUNDANT, AND SELF-ALIGNED THIN FILM TRANSISTORS

[75] Inventor: Yue Kuo, Chappaqua, N.Y.

[73] Assignee: International Business Machines Corporation, Armonk, N.Y.

[21] Appl. No.: 686,651

[22] Filed: Jul. 24, 1996

[51] Int. Cl.[6] .................................................. H01L 29/76
[52] U.S. Cl. ............................................. 257/66; 257/401
[58] Field of Search .............................. 257/401, 59, 66, 257/347, 346

[56] References Cited

U.S. PATENT DOCUMENTS

| | | | |
|---|---|---|---|
| 4,547,789 | 10/1985 | Cannella et al. | 357/23.7 |
| 4,623,908 | 11/1986 | Oshima et al. | 357/23.7 |
| 4,851,827 | 7/1989 | Nicholas | 340/811 |
| 4,894,690 | 1/1990 | Okabe et al. | 357/4 |
| 4,902,638 | 2/1990 | Muto | 437/51 |
| 4,907,861 | 3/1990 | Muto | 350/336 |
| 4,917,467 | 4/1990 | Chen et al. | 350/332 |
| 5,097,297 | 3/1992 | Nakazawa | 357/4 |
| 5,229,644 | 7/1993 | Wakai et al. | 257/749 |
| 5,338,959 | 8/1994 | Kim et al. | 257/331 |
| 5,410,164 | 4/1995 | Katayama et al. | 257/59 |
| 5,598,012 | 1/1997 | Hebiguchi | 257/59 |
| 5,684,318 | 11/1997 | Ayres et al. | 257/347 |

FOREIGN PATENT DOCUMENTS

| | | | |
|---|---|---|---|
| 61-290767 | 12/1986 | Japan | 257/401 |
| 1-53575 | 3/1989 | Japan | 257/401 |
| 5-173510 | 7/1993 | Japan . | |

*Primary Examiner*—Mark V. Prenty
*Attorney, Agent, or Firm*—Scully, Scott, Murphy & Presser

[57] ABSTRACT

Horizontally redundant thin film transistors (TFTS) are disclosed having a U-shaped split gate with at least two elongated sections separated by a slit. Dielectric and semiconductor layers are respectively formed over the split gate. The semiconductor layer has redundant channels located over the split gate and separated by the slit. A common source is formed over the slit and is separated from at least two drains by the redundant channels. The drains are formed over an outer periphery of the elongated sections. The source and drains are self-aligned to the split gate to minimize the source-to-gate overlap. Source and drain contacts are formed over the source and drains, respectively. The horizontally redundant TFT also has dielectric sections formed over the semiconductor layer and aligned with the split gate. The horizontally redundant has large W/L and $I_{on}/I_{off}$ ratios, and occupies a small area, which are particularly useful featutes in forming high quality displays.

8 Claims, 15 Drawing Sheets

SPLIT-GATE, HORIZONTALLY REDUNDANT, AND SELF-ALIGNED THIN FILM TRANSISTORS

BACKGROUND OF THE INVENTION

1. Field of Invention

The present invention is directed to redundant thin film transistors (TFTS) and more particularly, to a horizontally redundant self-aligned TFT having a split gate.

2. Discussion of the Prior Art

Thin film transistors (TFTs) have been successfully applied to large area active matrix liquid crystal displays (AMLCDs) and solid state imagers, detectors, sensors, and other devices having displays.

Among several popular structures, an inverted staggered TFT is most commonly used. The reason is because an inverted staggered TFT has several device advantages, such as, a low interface density of states, low off current $I_{off}$, high field-effect mobility $\mu_{eff}$, and low photo-leakage current.

An inverted staggered tri-layer TFT has an added advantage of a wide process window in one of the most critical steps, which is the step of etching a heavily doped n$^+$ layer. The wide process window reduces fabrication tolerance requirements. This is discussed in Y. Kuo, J. Electrochem. Soc., 139(2), 548 (1992).

Conventionally, a large TFT channel width (W) or a large width to length ratio (W/L) is used to increase the ON current $I_{on}$. For all applications, it is always desirable that the TFT has a high ON current ($I_{on}$), or a large $I_{on}/I_{off}$ ratio, so that each pixel of a display can be charged or discharged at a high speed. The OFF current $I_{off}$ is usually controlled by film-to-film interfaces and thin film material properties, and is in the range of $10^{-13}$ to $10^{-14}$ amps (A). The ON current $I_{on}$, which is proportional to channel width to length ratio W/L, can be increased by adjusting the transistor structure, e.g., by decreasing the channel length (L), or by increasing the channel width (W).

Decreasing the channel length (L) is limited by certain restrictions, such as:

1. capacity of tools, such as, resolution of a lithography tool;
2. process windows, such as, etch bias; and
3. device physics, such as, short-channel effects.

The channel width (W) is usually less susceptible to these restrictions. However, increasing the channel width (W) increases the transistor size. This is not desirable in light of the need to miniaturize transistors. In conventional displays using redundant TFTs having a large W/L ratio, in addition to increased (e.g., doubled) total TFT area, the aperture ratio (AR) of each pixel decreases. The aperture ratio (AR) is defined as the ratio of the TFT area to the pixel area. The increased TFT area and decreased pixel AR degrade display qualities, such as brightness, and increase display power consumption.

For large area array applications, it is important to design a TFT that can withstand large process variations so that yield can be maximized. One of the yield loss factors of the TFT LCD is the destruction of a number of TFTs during the TFT LCD fabrication process. A redundant TFT structure is often needed. Many redundant structures are used for this purpose, e.g., two TFTs attached to one pixel. Such TFTs having redundant structures are discussed in H. Ogura, M. Kunigita, M. Suekane, N. Imajo, S. Enoki, M. Yuki, and R. Muto, Japan Display '86, pp. 208–211 (1986).

However, conventional redundant two-TFT structures occupy twice the space as that of a single TFT. This increased area reduces the aperture ratio (AR) for each pixel. In addition, in some conventional redundant TFT structures, source-to-gate overlap area is high, which causes large gate-to-source parasitic capacitance Cgs. Other parts of the display, e.g., storage capacitor size, have to be modified to compensate for the undesirably large Cgs. Low AR and large Cgs are not desirable as they reduce display performance.

SUMMARY OF THE INVENTION

The object of the present invention is to provide a TFT that eliminates the problems of conventional TFTs.

Another object of the present invention is to provide a TFT that has a large channel width (W) to length (L) ratio (W/L).

Another object of the present invention is to provide a TFT with redundant channels, yet occupies a small area and has a large ON/OFF current ratio ($I_{on}/I_{off}$).

Yet another object of the present invention is to provide a TFT having a small gate-to-source parasitic capacitance Cgs.

A further object of the present invention is to provide a method of fabricating a TFT having a redundant channel structure, a small area, a large $I_{on}/I_{off}$ ratio, and a minimum Cgs.

These and other objects of the present invention are achieved by a horizontally redundant TFT comprising a split gate having at least two elongated sections separated by a slit. The split gate is U-shaped and the two elongated sections are parallel to each other, for example. Dielectric and semiconductor layers are respectively formed over the split gate. Illustratively, the split gate is molybdenum, chromium or nickel; the semiconductor layer is a hydrogenated amorphous silicon layer; and the dielectric layer is nitrides or oxides of silicon, or metal oxides.

The semiconductor layer has redundant channels located over the split gate and separated by the slit. A common source is formed over the slit and is separated from at least two drains by the redundant channels. The drains are formed over an outer periphery of the elongated sections.

The source and drains are self-aligned to the split gate, and an overlap of the source and gate is minimized. Source and drain contacts are formed over the source and drains, respectively.

The horizontally redundant TFT also has dielectric sections formed over the semiconductor layer and aligned with the split gate.

In another embodiment of the present invention, a display has a semiconductor device, such as the horizontally redundant TFT.

In yet another embodiment of the present invention, a method of forming a horizontally redundant thin film transistor comprises the steps of:

(a) forming a split gate on a substrate, the split gate having at least two elongated sections separated by a slit;

(b) forming over the split gate a tri-layer having bottom and top dielectric layers separated by a semiconductor layer;

(c) patterning the top dielectric layer to form dielectric sections which are self-aligned with the split gate, the dielectric sections defining redundant channels in portions of the semiconductor layer covered by the dielectric sections; and (d) forming a source and at least two drains, the source being formed over portions of the semiconductor layer covering the slit, and over inner portions of the dielectric sections; and the drains being formed over portions of the semiconductor layer covering the elongated sections, and over outer portions of the dielectric sections.

In another embodiment, instead of formin the tri-layer in step (b), a bi-layer is formed where the top dielectric layer of the tri-layer is omitted. In this case, the semiconductor layer is patterned in step (c).

A final annealing step may also be performed. The split gate forming step forms the elongated section parallel to each other using a mask. The patterning step comprises the steps of:

exposing portions of the top dielectric layer not overlapping the split gate to a light source located behind the substrate; and etching the exposed portion of the top dielectric layer.

In another embodiment, after the exposing step, a mask is formed and patterned over the top dielectric layer. The mask is removed after the etching step. In this embodiment, the etching step etches unmasked portions of semiconductor layer, and the redundant channels are totally covered by the split gate, when viewed from the back side of the substrate.

The source and drains forming step comprises the step of:

forming a heavily doped layer over the patterned top dielectric layer and exposed portions of the semiconductor layer;

forming a metal source/drain contact layer over the heavily doped layer; and etching portions of the heavily doped and metal layers to expose a portion of the top dielectric sections.

The source and drain forming step minimizes overlap between the source and split gate.

The inventive TFT has a split gate/redundant channel structure resulting in sub-TFTs. The inventive TFT withstands large process variations, thus reducing yield loss factor and increasing process yield. Despite having redundant channels/sub-TFTs, the inventive TFT occupies an area close to that of a single TFT; has an ON/OFF current ratio $I_{on}/I_{off}$ which is larger than the ratio of a single channel TFT; and is self-aligned to have a minimum gate-to-source parasitic capacitance Cgs. In addition, the inventive TFT in fabricated using a cost effective and simple method.

BRIEF DESCRIPTION OF THE DRAWINGS

Further features and advantages of the invention will become more readily apparent from a consideration of the following detailed description set forth with reference to the accompanying drawings, which specify and show preferred embodiment of the invention, wherein like elements are designated by identical references throughout the drawings; and in which.

DETAILED DESCRIPTION OF THE INVENTION

Figure 1:
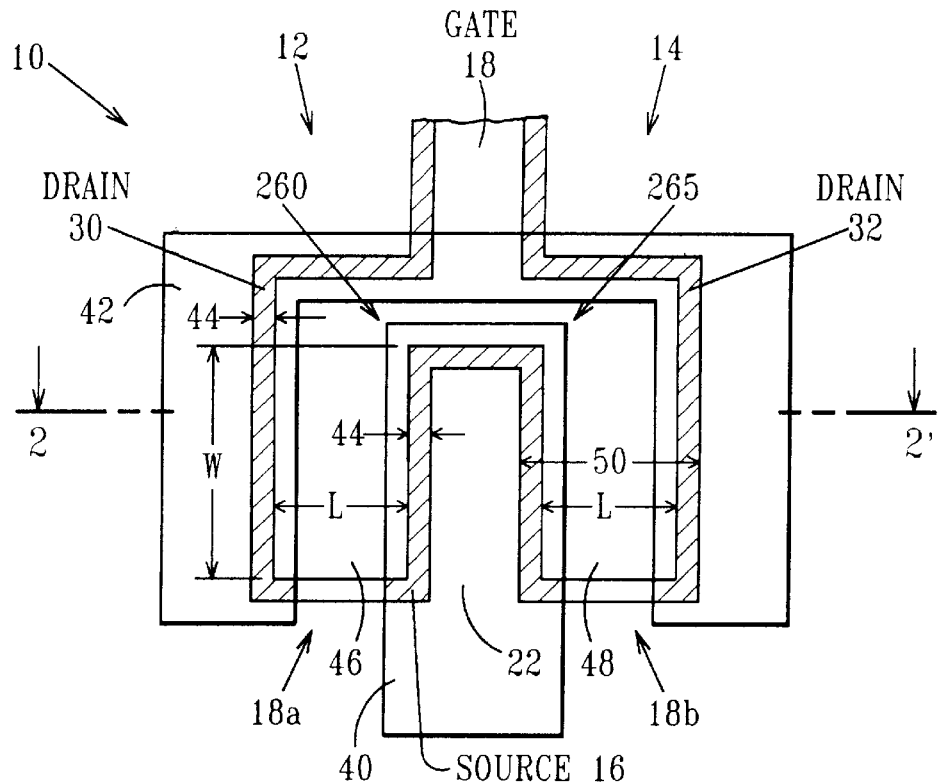
FIG. 1, 2 show top and cross-sectional views of a split-gate TFT device according to the present invention.
Figure 2:
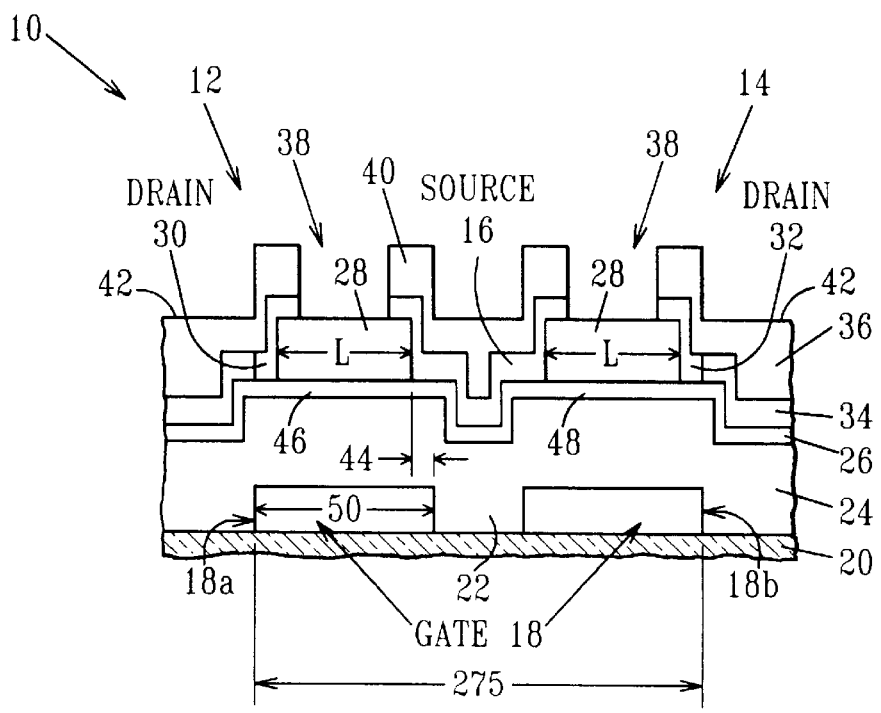

FIG. 1, 2 show one embodiment of the present invention. FIG. 1 shows a top view of a split-gate thin film transistor (TFT) device 10, and FIG. 2 shows a cross-section of the TFT 10 along the line 2—2' of FIG. 1. The TFT 10 is a horizontally redundant TFT which comprises two horizontal sub-TFTs 12, 14. The two horizontal sub-TFTs 12, 14 are interconnected and share the same source 16 and gate 18. The gate 18 is a split gate formed on a substrate 20, which may be glass for example. Illustratively, the split gate 18 is U-shaped having at least two elongated sections 18a, 18b which are parallel to each other and are separated by a slit 22. One of the elongated sections 18a acts as the gate of the first sub-TFT 12, while the other elongated section 18b acts as the gate of the second sub-TFT 14.

A first dielectric layer 24 is formed over the split gate and exposed portions of the glass 20. A semiconductor layer 26, which may be a hydrogenated amorphous silicon a-Si:H layer for example, is formed over the dielectric layer 24. Dielectric sections 28 are formed by patterning a second dielectric formed layer over the a-Si:H layer 26. Illustratively, the dielectric material of the dielectric layer 24 and dielectric sections 28 is nitrides or oxides of silicon, $SiN_x$, $SiO_x$, or metal oxides.

Each sub-TFT 12, 14 has its own drain 30, 32, respectively, located on opposite sides of the common source 16. The drains 30, 32 and common source 16 are formed by further doping portions of a heavily doped top semiconductor layer 34, which may be an $n^+$ silicon layer for example. The $n^+$ silicon layer 34 may be formed by plasma enhanced chemical vapor deposition (PECVD). Alternatively, the $n^+$ silicon layer 34 may be formed by exposing the entire structure to ion implantation or a non-mass-separation shower implantation process. The $n^+$ silicon layer 34 and a top metal layer 36 are formed over the dielectric sections 28 and exposed portions of the a-Si:H layer 26. The $n^+$ silicon and top metal layers 34, 36 are patterned to form vias 38 exposing portions of the dielectric sections 28.

The patterned top metalization layer 36 forms source and drain contacts 40, 42 located over the $n^+$ silicon layer 34, including the drains 30, 32 and source 16. Illustratively, the same metal is used for both the top metalization layer 36 and the split gate 18, and is molybdenum (Mo), chromium (Cr), or Nickel (Ni). The source and drain contacts 40, 42 cover the drains 30, 32 and source 16, as well as portions of the $n^+$ silicon layer 34 adjacent therto. Optianally, the $n^+$ silicon layer 34 may be omitted. In this case, the contacts 40, 42 act as the source and drains of the TFT 10.

The dielectric sections 28 are self-aligned with, and are slightly smaller than, the split gate 18, so that the drains 30, 32 and source 16 overlap the split gate 18. An overlap 44 between the dielectric sections 28 and split gate 18 is minimized. Illustratively, this overlap 44 is 0.5 micrometers ($\mu$m) when the dielectric sections 28 are self-aligned with the split gatep 18. In contrast, the overlap 44 is 2 $\mu$m without self-alignment. The self-aligned dielectric sections 28 result in the drains 30, 32 and source 16 being self-aligned with the split gate 18.

The source 16, and drains 30, 32 are self-aligned to the gate edge through a backlight lithography process discussed in the following reference which is incorporated herein by reference: Y. Kuo, J. Electrochem. Soc., 139(4), 1199 (1992).

The small source-to-gate overlap decreases the TFT's parasitic or gate-to-source capacitance $C_{gs}$. The TFT 10 has a $C_{gs}$ which is less than that of a single-channel TFT due to the advantage of the backlight lithography.

Due to the split gate structure, the TFT 10 has two channels 46, 48, one channel for each of the two sub-TFTs 12, 14. Illustratively, the width 50 of each elongated section 18a, 18b is approximately 4 micrometers to 5 micrometers. Accounting for the 0.5 micrometer overlap 44, results in each channel 46, 48 having a length (L) of approximately 3 micrometers to 4 micrometers long.

Depending on process steps, additional TFTs and channels may be formed using a modified split gate structure, for example, having two slits instead of the single slit 22. Having additional redundant TFTs is advantageous for high production yield, for example.

As shown in FIG. 1, the U-shaped slit 22 in the center of the gate 18 provides the TFT 10 with a channel width W. Each channel width W of the sub-TFTs 12, 14 has a dimension approximately similar to the length of the slit 22, and spans the elongated sections 18a, 18b, respectively. The actual channel width is larger than W due to the U-shaped slit 22 in the center of the gate pattern 18. The increased channel width W provides a large channel width-to-length ratio (W/L) to improve performance of the TFT 10.

The TFT 10 may be used to form displays and imagers, such as large area active matrix liquid crystal displays (AMLCDs) and solid state imagers, that require a high ON current $I_{on}$ and a low area occupancy. The TFT 10 may also be used to form detectors and sensors.

Figure 3:
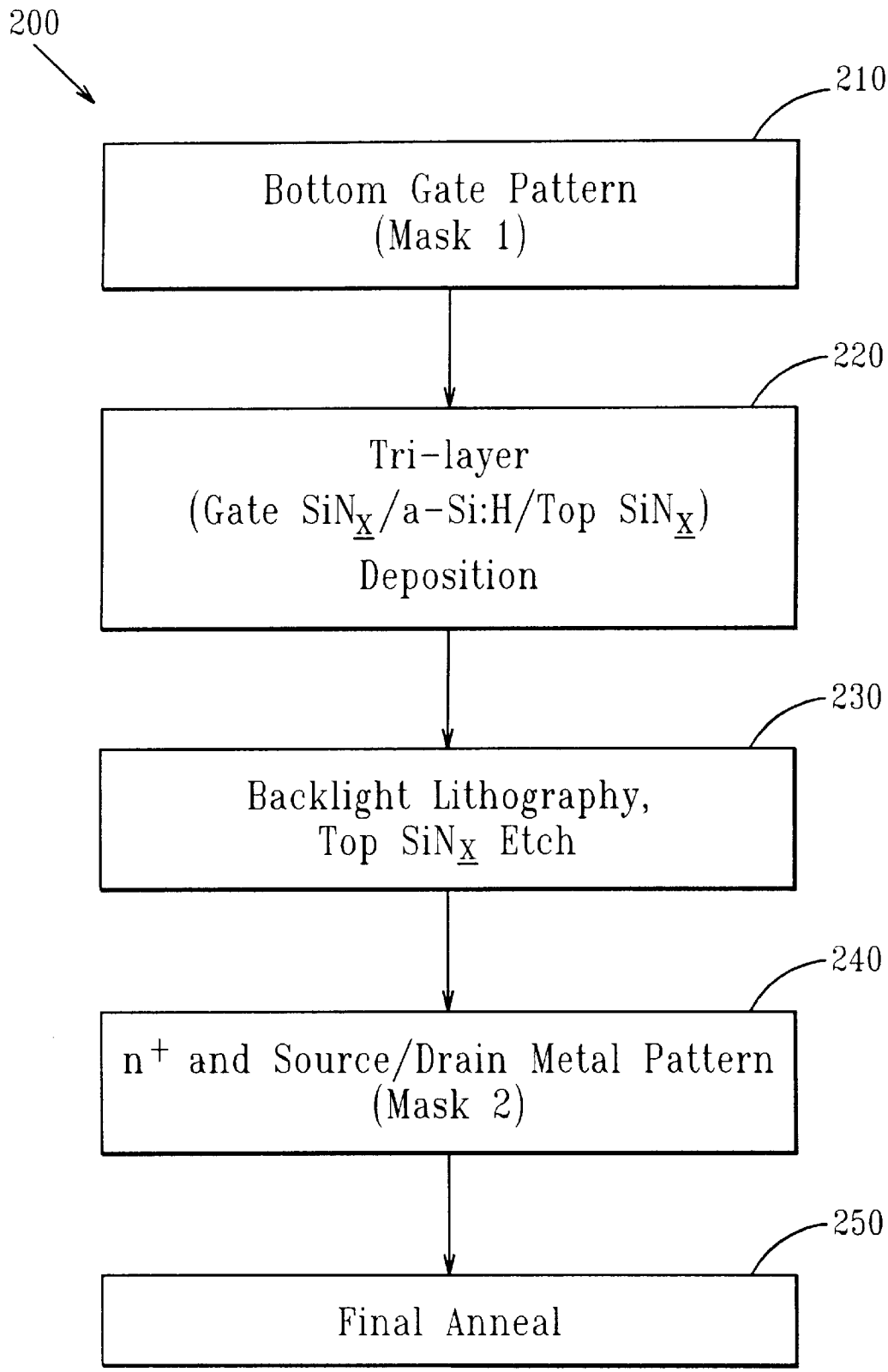
FIG. 3 shows a flow chart of a process for fabricating the split-gate TFT of FIGS. 1, 2, according to the present invention.

FIG. 3 shows a flow chart 200 depicting the steps of a method for forming the TFT 10. In step 210, the bottom split gate 18 is formed as follows. A metal layer is deposited on a substrate 20, which may be corning 7059 glass, for example. Illustratively, the metal layer is molybdenum(Mo), chromium (Cr), or aluminum (Al) and has a thickness of 1000° A.

Figure 4:
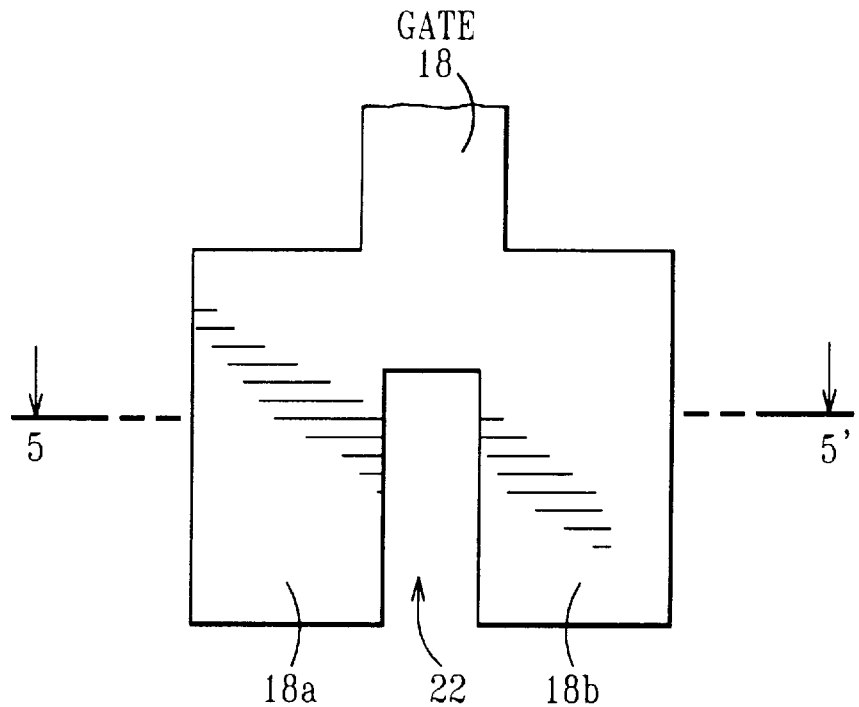
FIGS 4–15 illustrate the process of FIG. 3 using top and cross-sectional views of the split-gate TFT according to the present invention.
Figure 5:
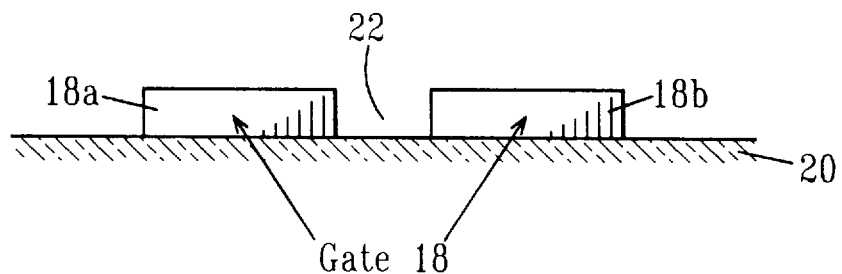

FIG. 5 is a cross-sectional view along line 5—5' of FIG. 4. As shown in top and cross-sectional views in FIGS. 4 and 5, a first mask is used to pattern the metal layer and form the split gate 18 over the substrate 20. The split gate 18 has at least two elongated section 18a, 18b, which are separated by the slit 22.

Figure 6:
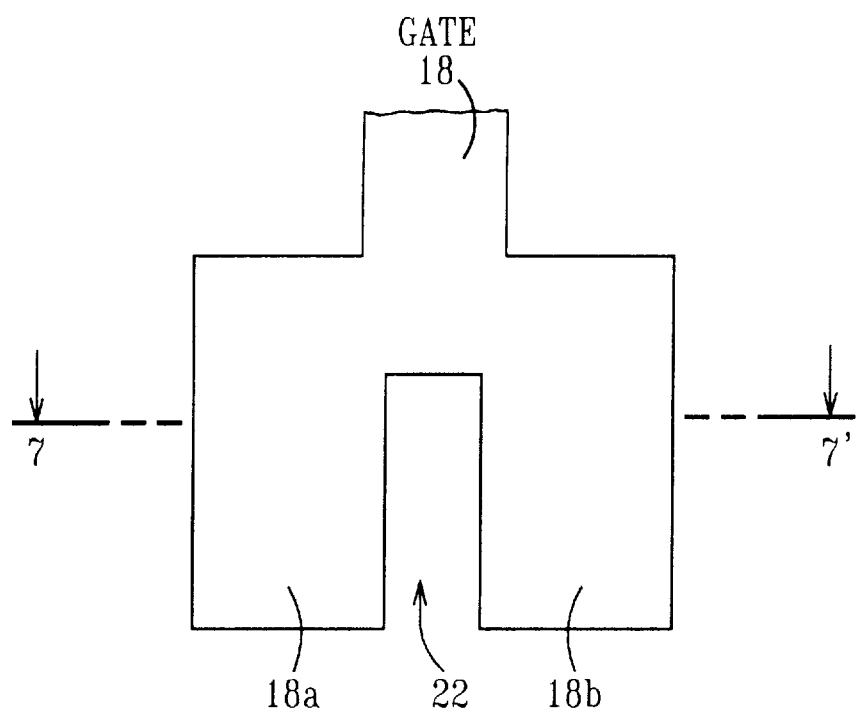
Figure 7:
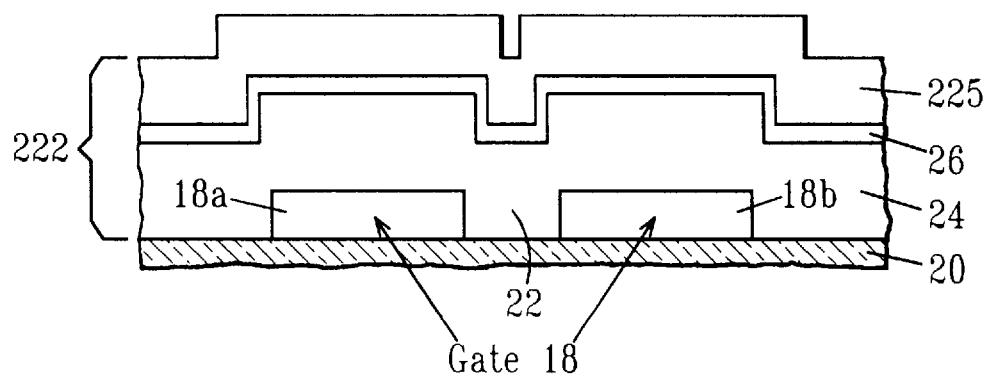

FIG. 7 is a cross-sectional view along line 7—7' of FIG. 6. In step 220 of FIG. 3, corresponding to the top and cross-sectional views shown in FIGS. 6 and 7, a tri-layer film 222 is deposited over the substrate 30 and the split gate 18. Illustratively, the tri-layer 222 is deposited in a multi-chamber plasma enhanced chemical vapor deposition (PECVD) system at 250° C.

The first bottom layer 24, of the tri-layer 222 is a dielectric layer; the second middle layer 26 is a semiconductor layer, such as hydrogenated amorphous silicon a-Si:H layer for example; and the third top layer 225 is another dielectric layer. The two dielectric layers 24 and 225 may be oxides or nitrides of silicon, $SiO_x$, $SiN_x$, or metal oxides, for example.

Illustratively, the thickness of the bottom gate dielectric $SiN_x$ layer 24 is approximately 4000° A.; the thickness of the middle a-Si:H layer 26 is approximately 500° A.; and the thickness of the top $SiN_x$ layer 225 is approximately 2000° A.

Figure 8:
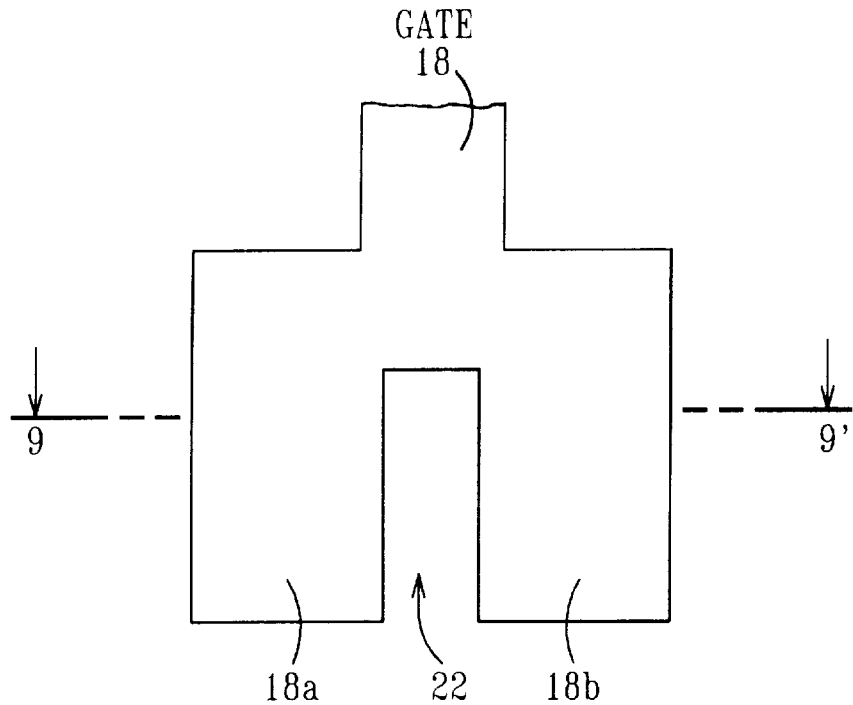
Figure 9:
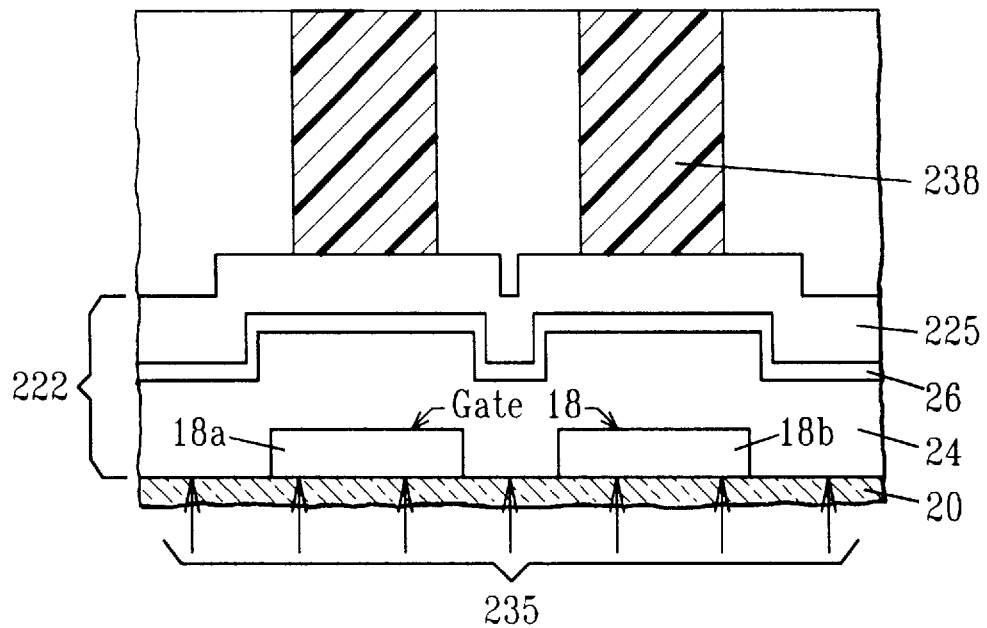
Figure 10:
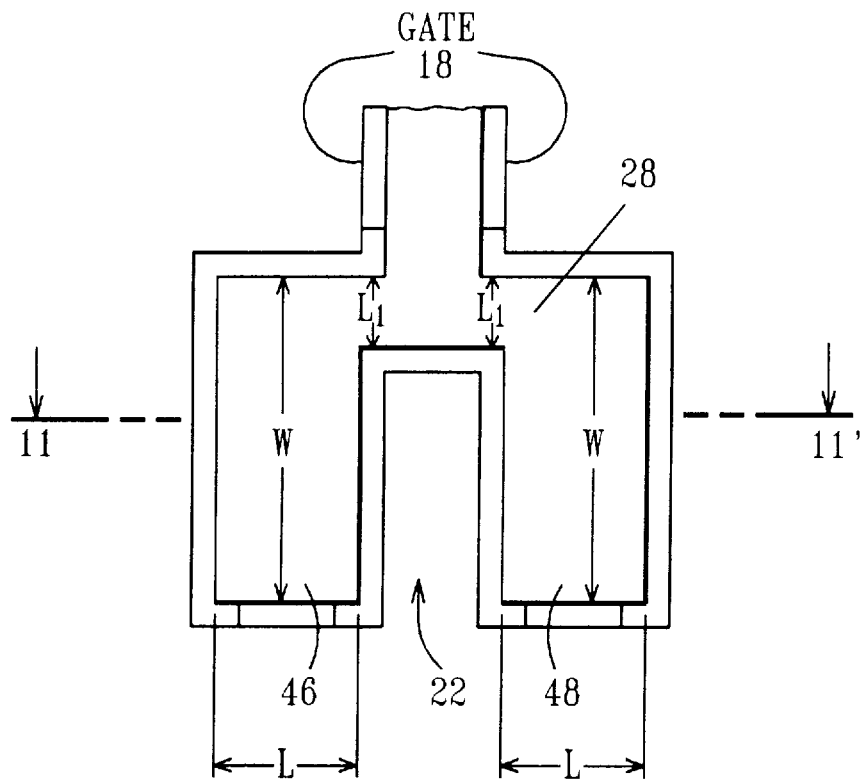
Figure 11:
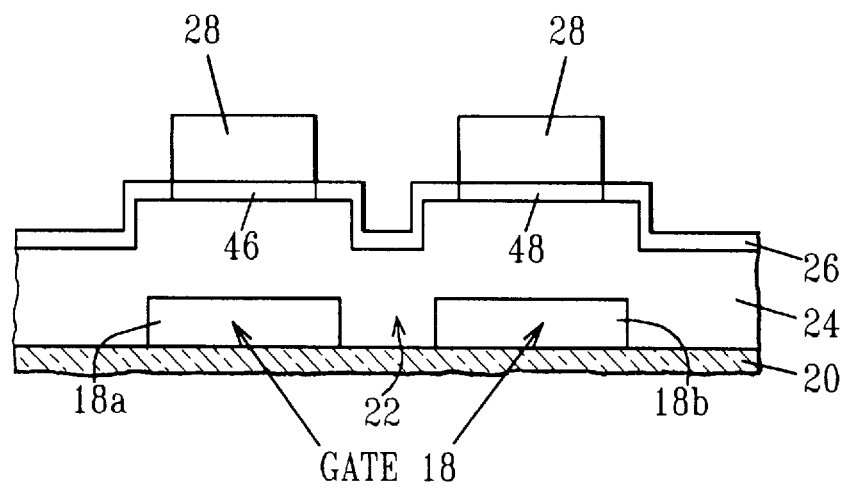

FIG. 9 is a cross-sectional view of the structure shown in FIG. 8 along line 9—9', and FIG. 11 is a cross-sectional view of the structure shown in FIG. 10 along line 11—11'. In step 230 of FIG. 3, associated with FIGS. 8–11, the top dielectric layer 225 is patterned to form dielectric sections 28 which are self-aligned with the split gate 18. The dielectric sections 28 define the redundant channels 46, 48 in portions of the semiconductor layer 26 covered by the dielectric sections 28.

Illustratively, the patterning step includes backlight lithography and etch of the top $SiN_x$ layer 225. As shown in FIGS. 8 and 9, backlight exposure is performed, shown as arrows 235. In this embodiment, the patterning step comprises the steps of:

exposing portions of the top dielectric layer 225 not overlapping the split gate 18 to a light source located behind the substrate 20; and etching the exposed portion of the top dielectric layer 225.

Illustratively, a mercury lamp is used for the backlight exposure, as discussed in Y. Kuo, J. Electrochem. Soc., 139(4), 1199 (1992). The backlight exposure defines the top dielectric sections 28, as shown in FIGS. 10 and 11. The exposed region of the top $SiN_x$ layer 225 is etched. For example, wet etched with a buffered hydrofluoric (BHF) acid solution. This removes any native oxides and forms the dielectric sections 28.

In another embodiment, after the backlight exposure step, and after the top dielectric layer 225 is patterned, e.g., etched off, to form the top $SiN_x$ sections 28 shown in FIG. 11, the a-Si:H layer 26 not covered by a second photoresist mask 238 is also etched, for example, using reactive ion etching (RIE). In this case, the a-Si:H channel is totally covered by the split-gate pattern when viewed from the backside (i.e., the bottom side) of the substrate 20.

In yet another embodiment, the second mask 238 is formed and patterned over the top dielectric layer 225. The mask 238 is removed after the etching step. Note the mask 238 is a second mask used in this process; the first mask being the one used to form the split gate 18 shown in FIGS. 4 and 5. In this alternate method, the a-Si:H layer 26 not covered by the mask 238 is also etched, for example, using reactive ion etching (RIE). Note, the same mask 238 used to form the dielectric sections 28 is used to etch the a-Si:H layer 26. In this embodiment, the a-Si:H channel is totally covered by the split-gate pattern when viewed from the backside (i.e., the bottom side) of the substrate 20. These last two embodiments are similar to an embodiment to be discussed in connection with FIG. 25.

The resultant structure, shown in FIGS. 10 and 11, is a self-aligned TFT structure, where the top $SiN_x$ regions or sections 28 are located above and within the gate 18.

Figure 12:
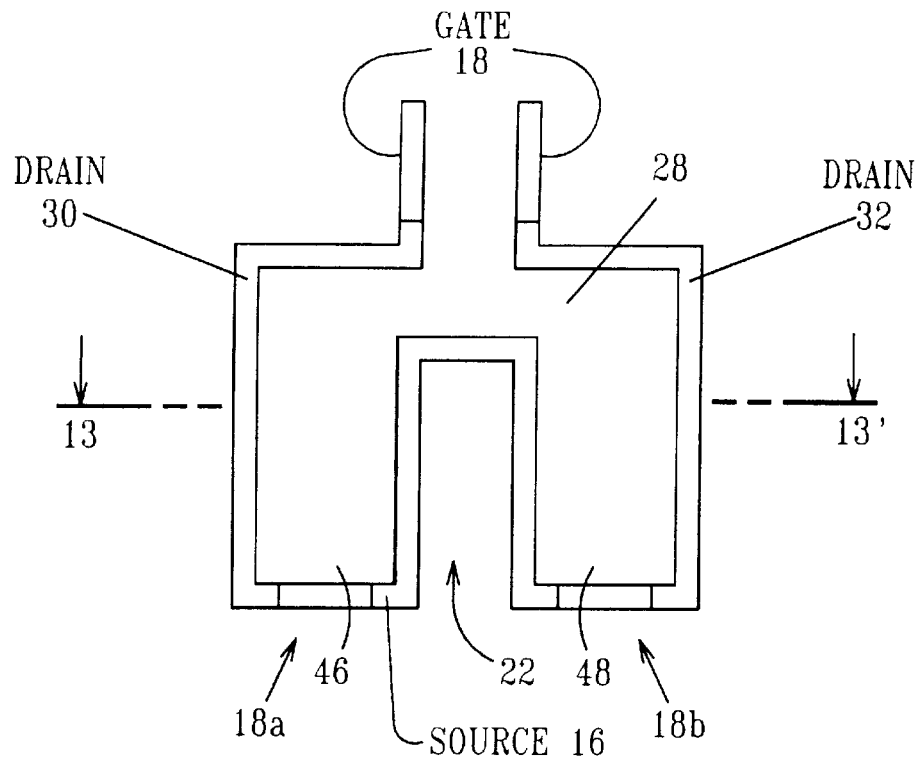
Figure 13:
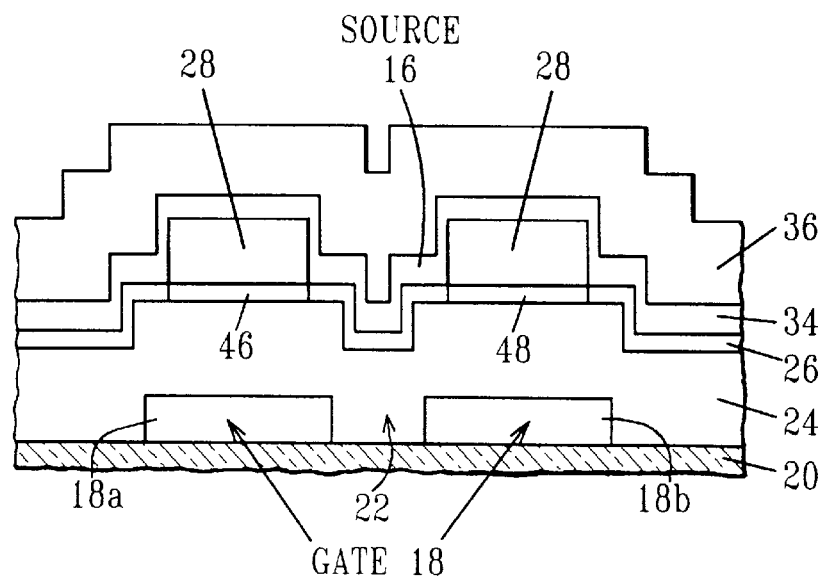
Figure 14:
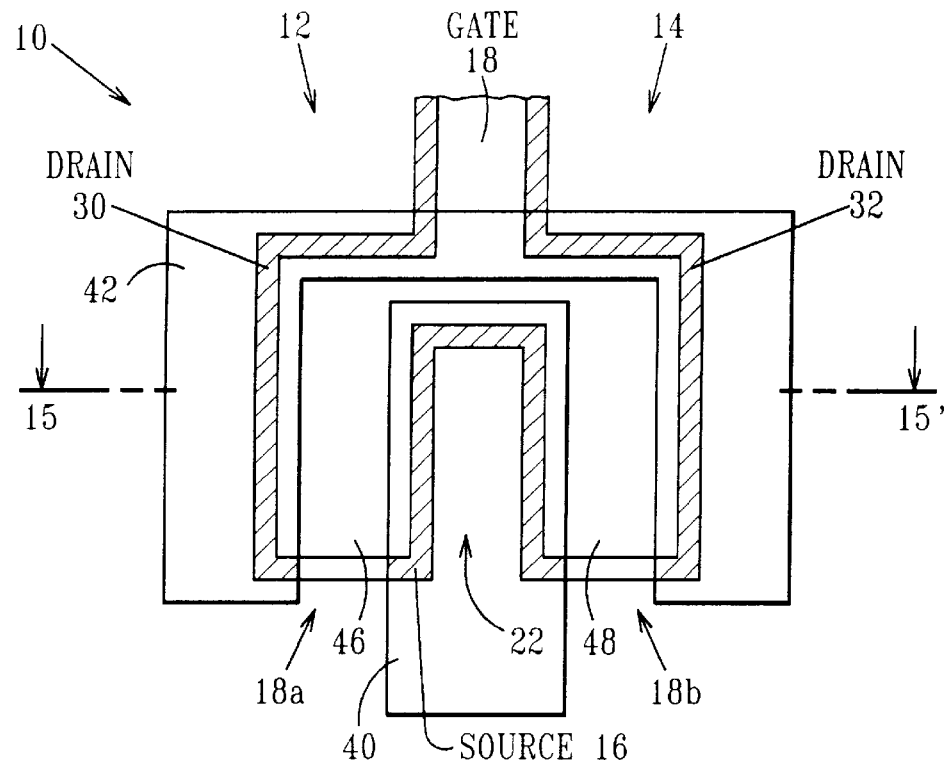
Figure 15:
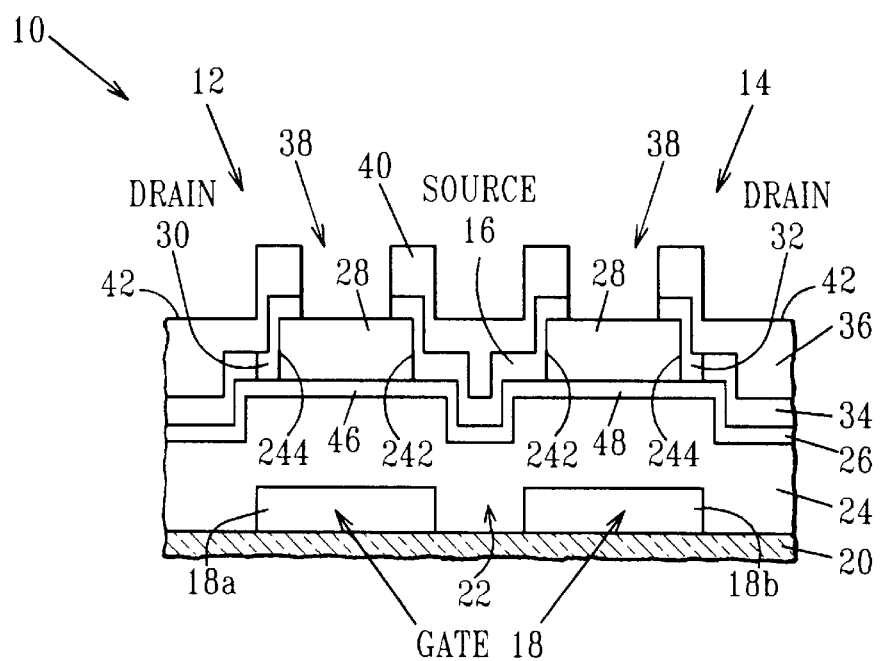

FIG. 13 is a cross-sectional view of the structure shown in FIG. 12 along line 13—13', and FIG. 15 is a cross-sectional view of the structure shown in FIG. 14 along line 15—15'. Step 240 of FIG. 3 corresponds to FIGS. 12–15. As shown in FIGS. 12 and 13, a heavily doped silicon layer, e.g., amorphous or micro-crystalline $n^+$ layer 34, is deposited on the top $SiN_x$ regions 28 and an exposed portion of the amorphous silicon a-Si:H layer 26. Next, a metal layer 36, e.g., a molybdenum, chromium, or aluminum layer, is deposited over the $n^+$ layer 34. Illustratively, the thickness of the $n^+$ layer 34 and metal layer 36 are approximately 500° A. and 1000° A., respectively.

Referring to FIGS. 14 and 15, another mask (not shown) is used to define source 16 and drains 30, 32 by dry or wet etching portions of the metal contacts and $n^+$ layers 36, 34. This mask is a second mask used in the embodiment where backlight lithography is used, and a third mask in the case where an additional mask is used to pattern the top $SiN_x$ sections 28 and the a-Si:H layer 26.

Illustratively, in step 240, after forming the n⁺ and metal layers 34, 36, and forming the last mask, etching is performed, for example, with wet solutions or plasma etching processes.

The source 16 and source contact 40 are formed over portion of the semiconductor layer 26 covering the slit 22, and over inner portions 242 of the dielectric sections 28. The two drains 30, 32 are formed over portions of the semiconductor layer 26 covering the elongated sections 18a, 18b of the split gate 18, and over outer portions 244 of the dielectric sections 28.

The source and drains forming step minimizes overlap between the source 16 and gate 18, as well as the overlap between the drains 30, 32 and the gate 18.

As shown is step 250 of FIG. 3, after etching and removal of the last mask, the completed TFT 10 is annealed, e.g., at approximately 250° C. for about 2 hours.

For TFT LCD applications, the above steps can be used in combination with other process steps, such as those for opening of contact pads for tabs and for the definition of electrodes, such as an indium tin oxide electrode(ITO). These additional steps are the same as those used in a conventional TFT LCD process. Storage capacitors can be fabricated on the gate line using the same steps.

The inventive TFT is useful in active matrix liquid crystal displays (AMLCDs), such as large area AMLCDs and solid state imagers, that require a high ON current $I_{on}$ and a low area occupancy. The TFT 10 may also be used to form detectors, sensors, and other TFT-related products. Other semiconductors, such as poly-Si and CdSe, can also be used to prepare the inventive TFT.

Figure 16:
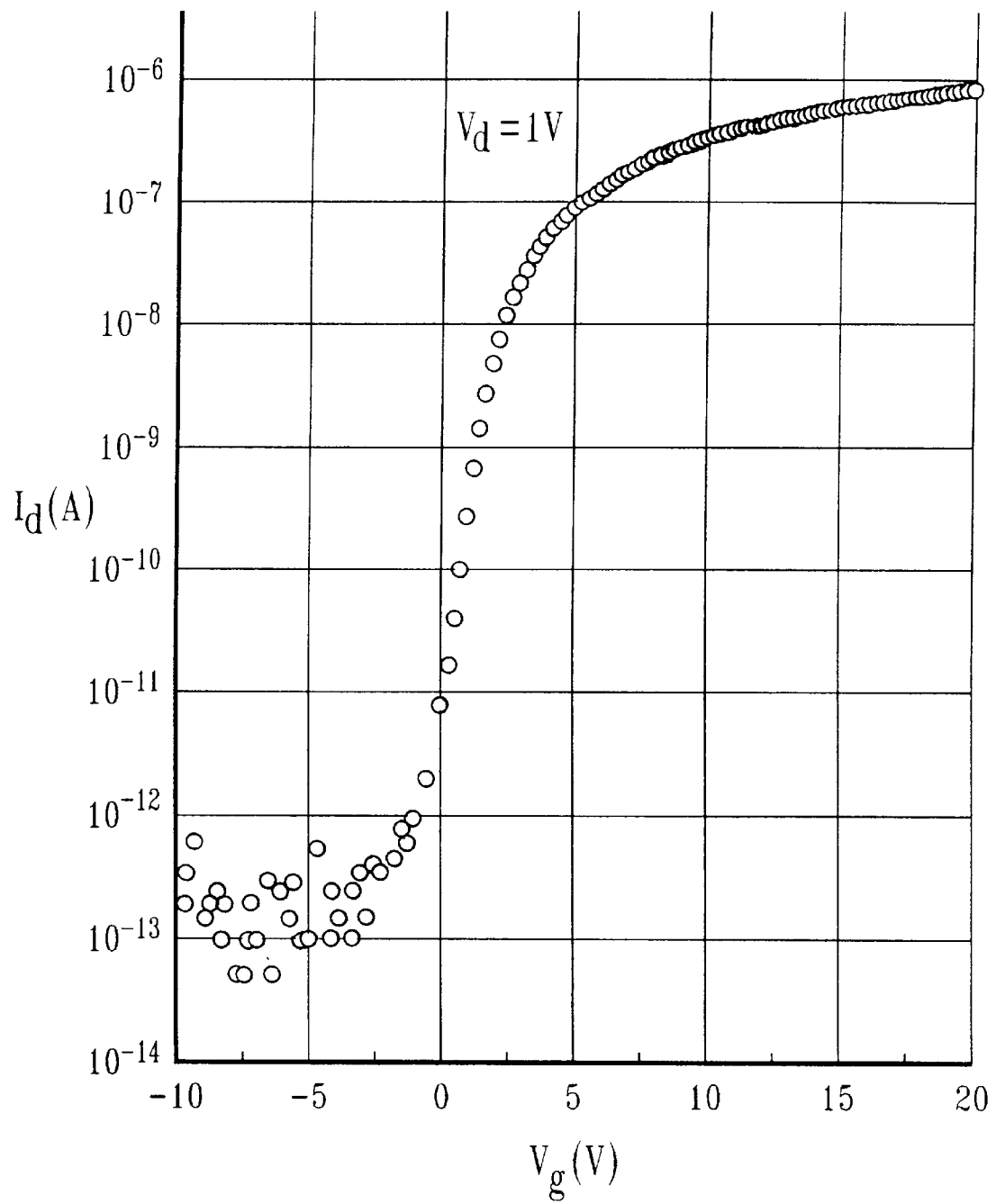
FIG 16 is a plot of transfer characteristics of the spit-gate TFT of FIGS. 1, 2, according to the present invention.

The TFT transfer characteristics and $I_d$ vs. $V_d$ curves are measured using a HP 4145b parameter analyzer. FIG. 16 shows transfer characteristics of a TFT with a W/L ratio of 72 $\mu$m/8 $\mu$m. The transistor has an $I_{on}/I_{off}$ ratio greater than $10^7$, a threshold voltage $V_{th}$ 2.5 V, and a $\mu_{eff}$ 0.45 cm²/Vs. There is no current crowding in $I_d$ vs. $V_d$ curves, which indicates good ohmic contact formation at source and drain areas.

Figure 17:
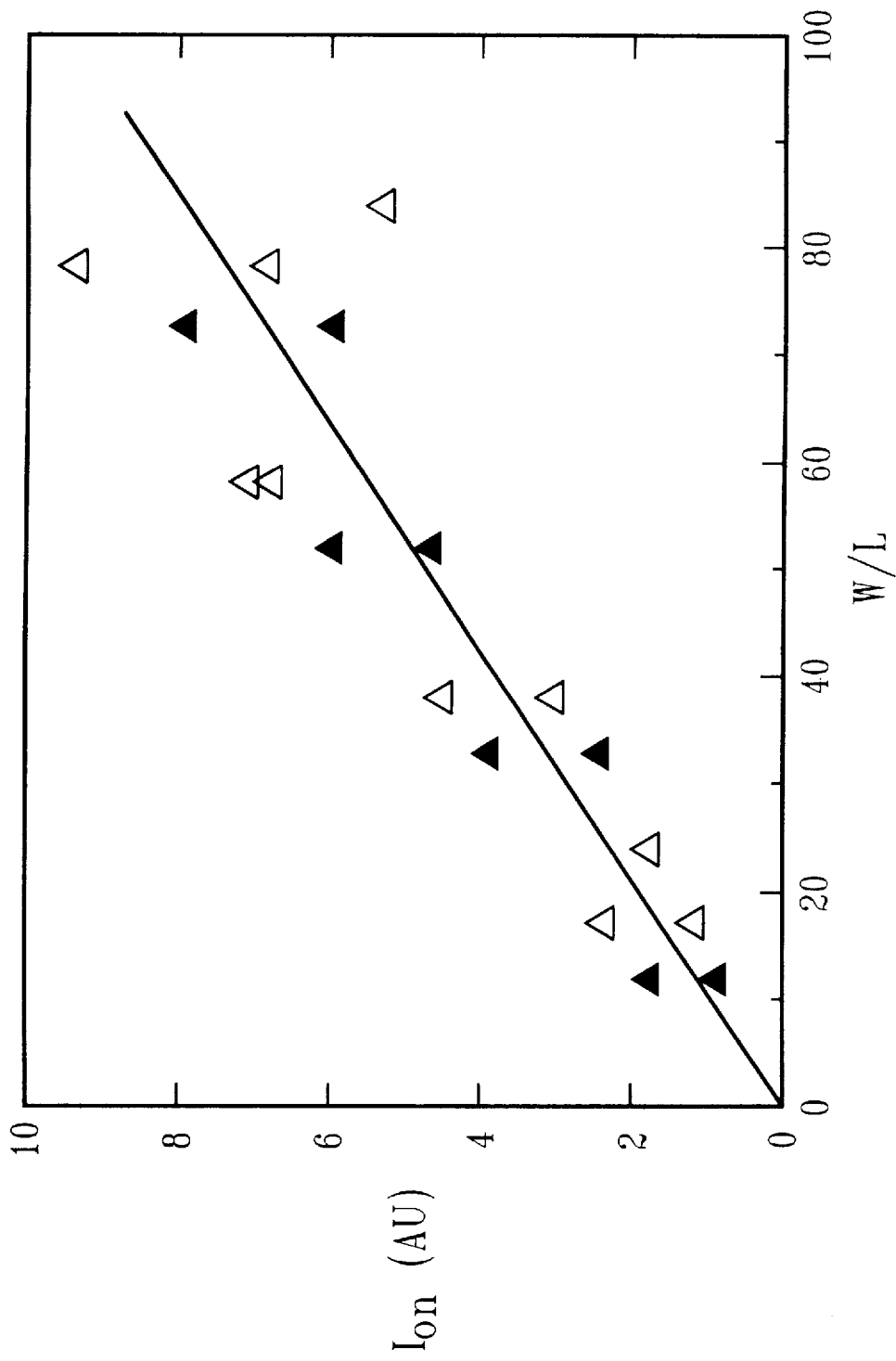
FIG 17 is plot of ON current as a function of channel width to length ratio W/L for the split-gate TFT of FIGS. 1, 2, according the present invention.

FIG. 17 shows that the ON current $I_{on}$ is linearly proportional to the W/L ratio at different channel lengths.

Returning to FIGS. 1 and 2, since two cornered areas 260, 265 are included in the current path, they may contribute to the extra ON current $I_{on}$. If this were true, the linear regression line in FIG. 17 should have extrapolated to a positive $I_{on}$ value at W/L=0. Because this is not observed, the contribution of the cornered areas to the total ON current $I_{on}$ is negligible.

In yet another embodiment, another method of forming a horizontally redundant thin film transistor includes steps similar to the previously described methods. In this alternate method, instead of forming the tri-layer 222 comprising the $SiN_x/a$-Si:H/$SiN_x$ layers 24, 26, 225 shown in FIG. 7, a bi-layer is formed over the structure shown in FIG. 5. The bi-layer does not include the top $SiN_x$ layer 225 of FIG. 7.

Figure 18:
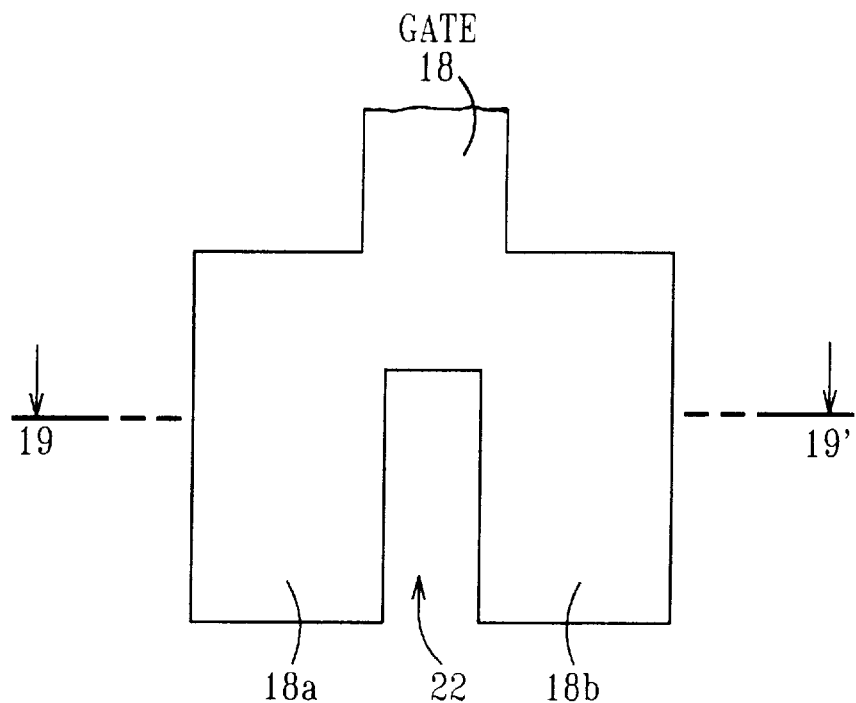
FIGS. 18–27 illustrate another process using top and cross-sectional views of another split-gate TFT according to the present invention.
Figure 19:
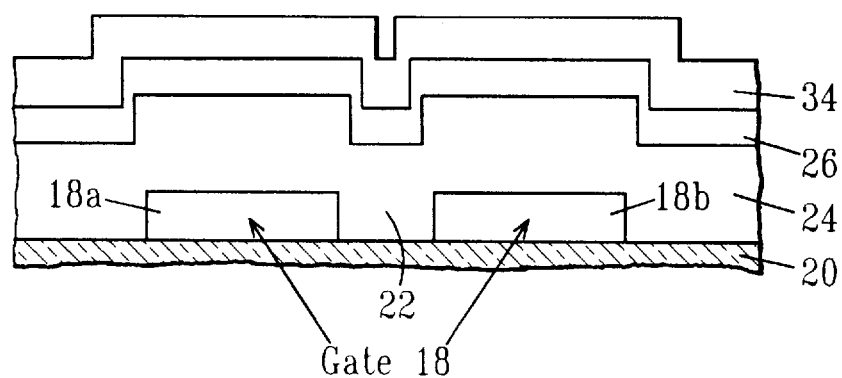

As shown in FIG. 19, which is a cross-sectional view of FIG. 18 along line 19—19', the bi-layer comprises a dielectric layer, such as silicon nitrides or oxides, or metal oxides, e.g., $SiN_x$ layer 24, and a semiconductor layer, e.g., a-Si:H layer 26. The bi-layer is formed over the split gate 18 in the same manner described in connection with FIG. 7. An optional heavily doped n⁺ layer 34 is formed over the a-Si:H layer 26 in the same manner described in connection with FIG. 13.

Figure 20:
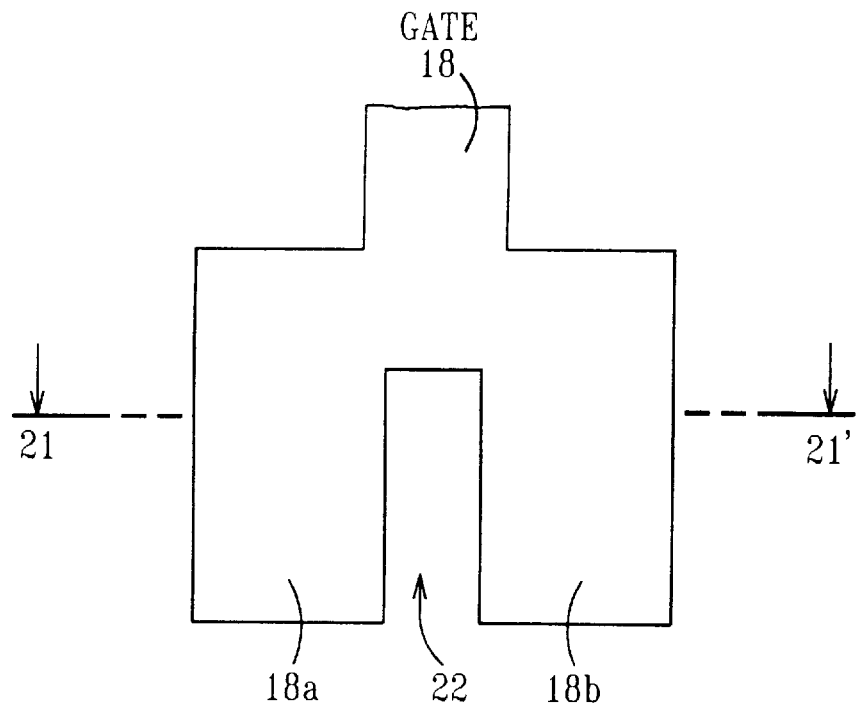
Figure 21:
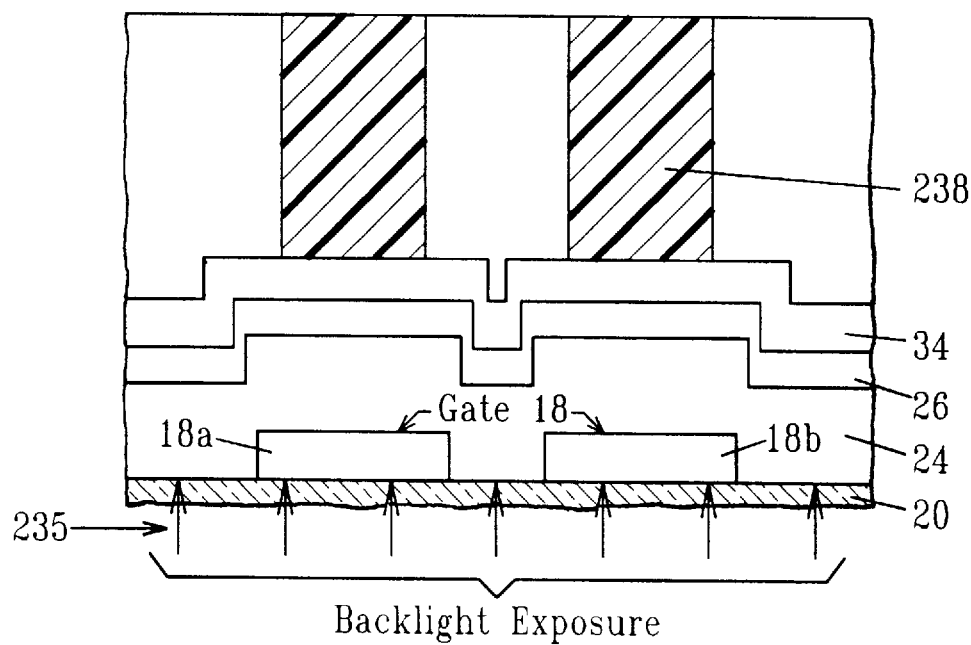

As shown in FIG. 21, which is a cross-sectional view of FIG. 20 along line 21—21', photoresist 238 is formed over portions of the n⁺ layer and backlight exposure of the photoresist 238 is performed. This is similar to the steps described in connection with FIG. 9.

Figure 22:
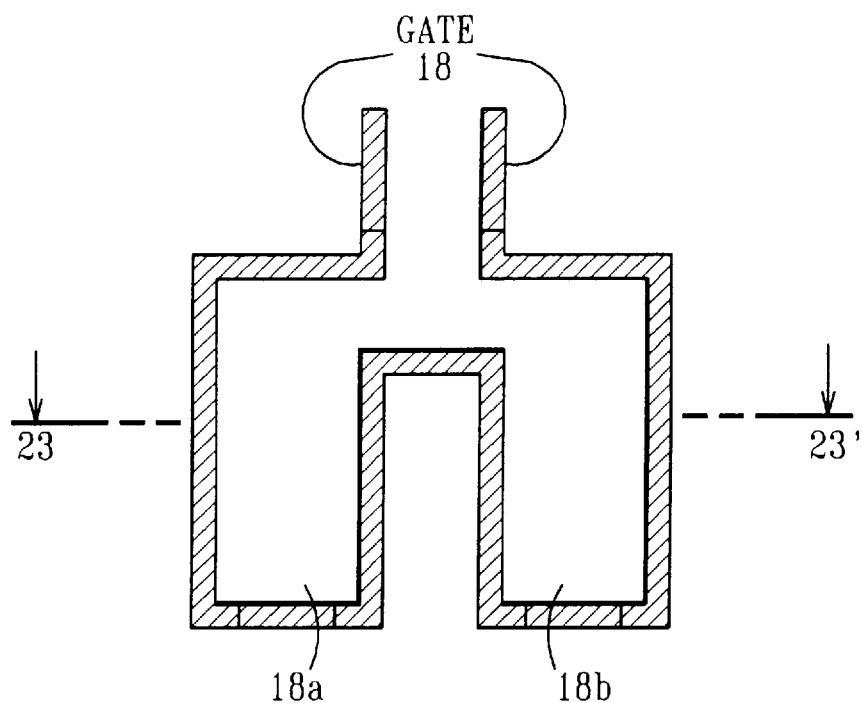
Figure 23:
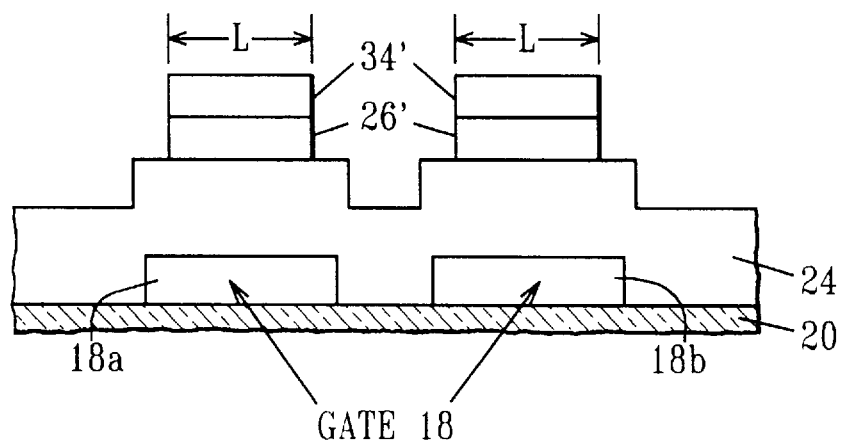

As shown in FIG. 23, which is a cross-sectional view of FIG. 22 along line 23—23', after developing the photoresist 238, the n⁺ and a-Si:H layers 34, 26 of FIG. 21 are etched with the photoresist pattern to form n⁺ and a-Si:H sections 34', 26'. Thereafter, the photoresist 238 of FIG. 21 is removed. The resultant structure of FIG. 23 may be compared to the structure shown in FIG. 11. The n⁺ and a-Si:H sections 34', 26' are self-aligned with the split gate 18, where the a-Si:H sections 26' define redundant TFT channels, each having a length L.

Figure 24:
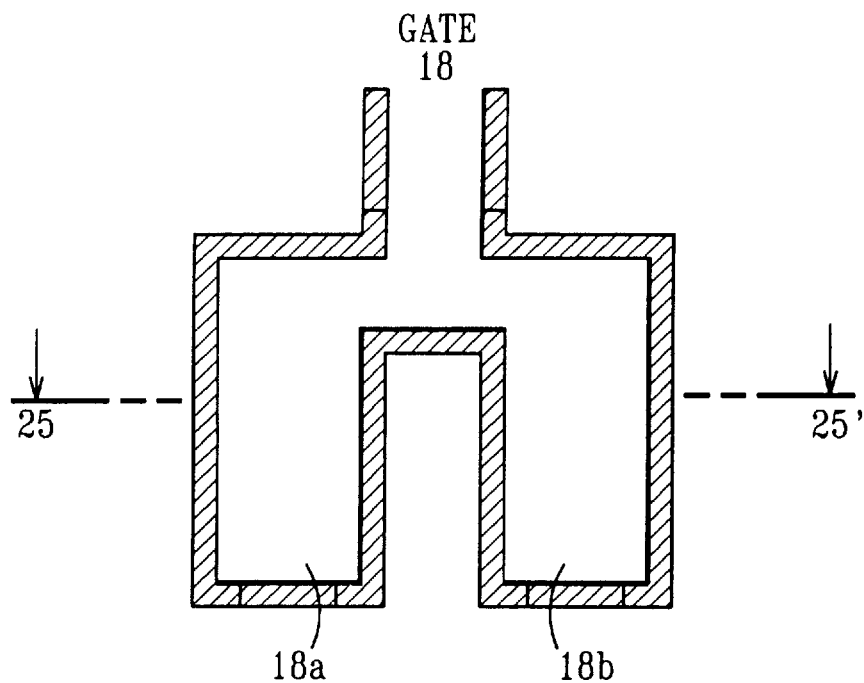
Figure 25:
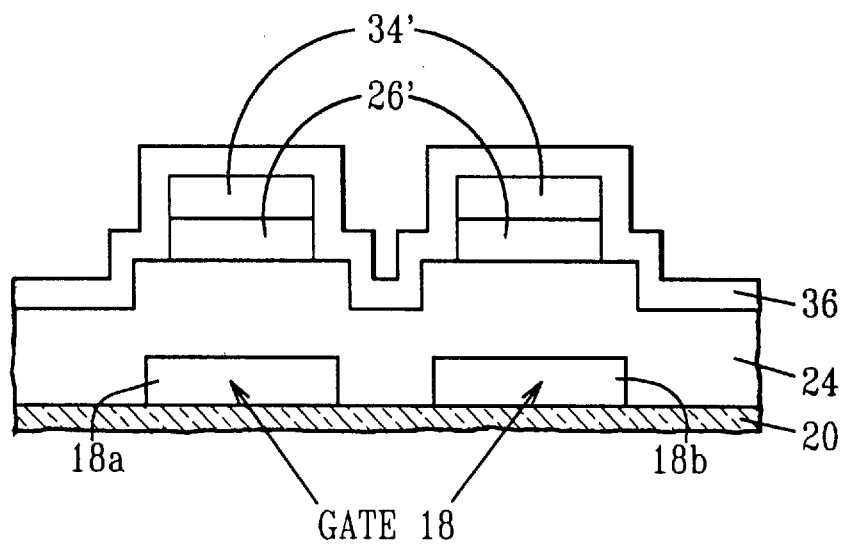

As shown in FIG. 25, which is a cross-sectional view of FIG. 24 along line 25—25', a top metal layer 36 is formed over the structure of FIG. 23. This step is similar to that described in connection with FIG. 13.

Figure 26:
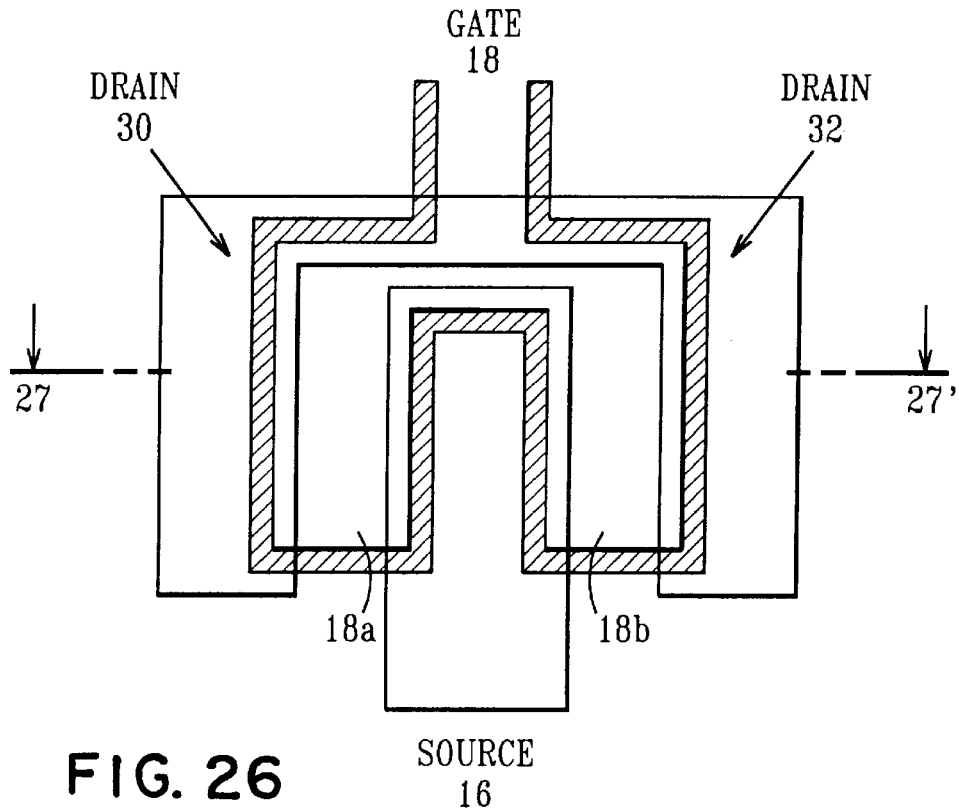
Figure 27:
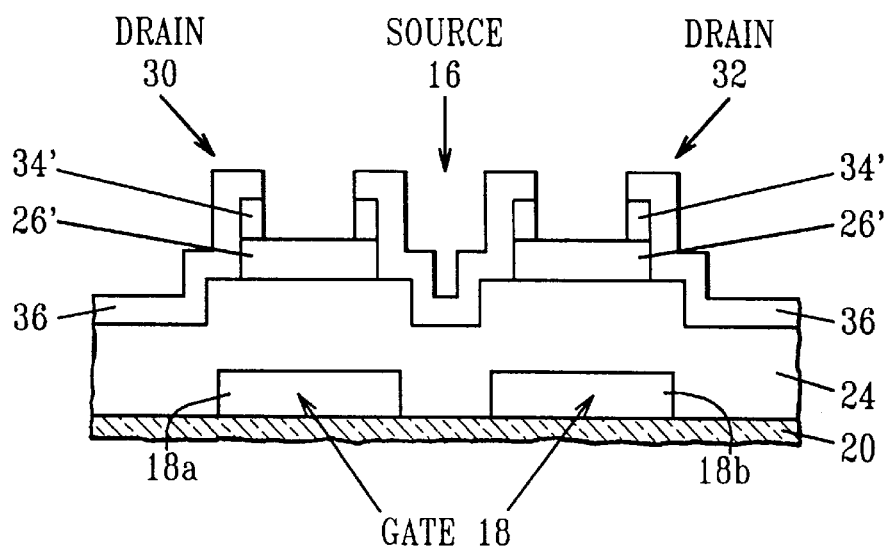

As shown in FIG. 27, which is a cross-sectional view of FIG. 26 along line 27—27', source 16 and at least two drains 30, 32 are formed, using a mask (not shown) and etching through portions of the top metal layer 36 and the n⁺ section 34'. Removing the mask layer results in a split gate redundant TFT 10', having sub-TFTs 12', 14' shown in FIG. 27. The TFT 10' is comparable to the TFT 10 shown in FIG. 15.

There are at least two factors that contribute to the performance of the split-gate TFT 10: (1) the geometry of the slit in the gate area; and (2) the backlight lithography characteristics. The first factor increases the channel width and supplies the redundant channel structure. The second factor shortens the channel length, forms the self-aligned source/drain area, and minimizes the width of the source/drain via 38.

In principle, a very high W/L ratio is achieved by making the slit 22 in the gate 18 thin and long. However, there are physical limitations on the size of the slit 22. For a large area lithography tool, such as that used in TFT LCD, the optical resolution and the alignment accuracy are in the range of 1 micrometers to 2 micrometers, which are much larger than those of a VLSI lithography tool. A slit width of about 2 micrometers may be obtained.

The TFT channel length L depends on the gate width, which is determined by four parameters: the undercut of the backlight exposure, the etch bias of the top $SiN_x$ layer 225 (FIGS. 8 and 9), the layer-to-layer alignment tolerance, and the optical resolution.

Since the source and drain are consistently aligned to the gate edge, the last mask, which is used to pattern the source/drain metal contacts 40, 42 (FIGS. 14 and 15), can be directly aligned to the first mask which is used to pattern the split gate 18.

Referring to FIG. 1, illustratively, the width 50 of each elongated sections 18a, 18b, of the gate 18 is about 4 micrometers to 5 micrometers, which results in a channel length L of about 3 micrometers to 4 micrometers. In this embodiment, the total gate width 275, including the slit 22 and both elongated sections 18a, 18b, is about 12 micrometers to 14 micrometers.

Assuming the same total gate width 275 is used to build a conventional non-self-aligned TFT, i.e., with source and drain vias located on top of the gate pattern, the minimum obtainable channel length would be about 5 micrometers to 6 micrometers.

If a long slit 22 is used in the split gate TFT 10, its channel width W, as well as the W/L ratio, can be double that of the non-split gate conventional TFT. Therefore, the inventive split-gate TFT 10 has a major advantage of high $I_{on}$.

The inventive TFT that has a redundant channel structure resulting in sub-TFTs. If one of the channels or sub-TFTs is accidentally destroyed, the inventive redundant TFT remains operational. The inventive TFT withstands large process variations. The inventive TFT and its fabrication method reduce yield loss factor, thus increasing process yield.

Despite having redundant channels/sub-TFTs, the inventive TFT occupies an area close to that of a single conventional TFT; has a larger ON/OFF current ratio ($I_{on}/I_{off}$) than a conventional single channel TFT; and is self-aligned to have a minimum gate-to-source parasitic capacitance Cgs. In addition, the inventive TFT is fabricated using a cost effective and simple method.

In summary, a new TFT that has a split-gate structure is fabricated having horizontally redundant self-aligned TFTS. Compared with a conventional single-channel TFT, the inventive TFT has the advantages of 1)redundant channels, 2)long channel length, 3)uniformly narrow-width source/drain vias, and 4)large W/L ratio. The $I_{on}$, which is proportional to the W/L ratio, is large. The transistor characteristics are as good as a conventional TFT, e.g., $I_{on}/I_{off}$>$10^7$, $V_{th}$ of 2.5 V, and $\mu_{eff}$ of 0.45 cm$^2$/Vs.

Compared with a conventional single-channel TFT that occupies the same area, the inventive TFT has a 20% to 300% improvement in the W/L ratio based on the same design rule, i.e., based on the same alignment tolerance and critical dimensions.

While the invention has been particularly shown and described with respect to illustrative and preformed embodiments thereof, it will be understood by those skilled in the art that the foregoing and other changes in form and details may be made therein without departing from the spirit and scope of the invention which should be linked only by the scope of the appended claims.

Having thus described our invention, what we claim as new, and desire to secure by Letters Patent is:

1. A horizontally redundant thin film transistor comprising:
   a split gate formed on a substrate, said split gate having at least two elongated sections separated by a slit;
   a dielectric layer formed over said split gate;
   dielectric sections formed over a semiconductor layer and aligned with said split gate;
   said semiconductor layer formed over said dielectric layer, said semiconductor layer having redundant channels located over said split gate and separated by said slit;
   a source formed over said slit; and
   at least two drains formed over an outer periphery of said at least two elongated sections.

2. The horizontally redundant thin layer transistor of claim 1, wherein said at least two elongated sections are parallel to each other.

3. The horizontally redundant thin film transistor of claim 1, wherein said split gate is U-shaped.

4. The horizontally redundant thin film transistor of claim 1 further comprising source and drain contacts formed over said source and drains, respectively.

5. The horizontally redundant thin film transistor of claim 1, wherein said split gate in one of molybdenum, chromium and nickel.

6. The horizontally redundant thin film transistor of claim 1, wherein said semiconductor layer is a hydrogenated amorphous silicon layer.

7. The horizontally redundant thin film transistor of claim 1, wherein said dielectric layer is one of nitrides of silicon, oxides of silicon and metal oxides.

8. A display having a semiconductor device, said semiconductor device comprising:
   a split gate having a plurality of elongated sections separated by a slit;
   a source formed over said slit;
   at least two drains formed over an outer periphery of said plurality of elongated sections;
   redundant channels formed between said source and drains, said redundant channels being located over said plurality of elongated sections; and
   dielectric sections formed over said redundant channels and aligned with said split gate.

* * * * *